United States Patent
Peethala et al.

(10) Patent No.: US 11,004,735 B2
(45) Date of Patent: May 11, 2021

(54) CONDUCTIVE INTERCONNECT HAVING A SEMI-LINER AND NO TOP SURFACE RECESS

(71) Applicant: International Business Machines Corporation, Armonk, NY (US)

(72) Inventors: Cornelius B. Peethala, Slingerlands, NY (US); Michael Rizzolo, Albany, NY (US); Oscar Van Der Straten, Guilderland Center, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/131,354

(22) Filed: Sep. 14, 2018

(65) Prior Publication Data

US 2020/0090988 A1    Mar. 19, 2020

(51) Int. Cl.
*H01L 23/48*  (2006.01)
*H01L 23/52*  (2006.01)
*H01L 29/40*  (2006.01)
*H01L 21/768*  (2006.01)
*H01L 23/532*  (2006.01)

(52) U.S. Cl.
CPC .. *H01L 21/76846* (2013.01); *H01L 21/76865* (2013.01); *H01L 21/76873* (2013.01); *H01L 21/76883* (2013.01); *H01L 23/53238* (2013.01)

(58) Field of Classification Search
USPC .......... 257/751, E21.575–E21.597, E21.627, 257/E21.641, 522, E23.013; 438/319, 438/411–413, 412–422
See application file for complete search history.

(56) References Cited

U.S. PATENT DOCUMENTS

| | | | |
|---|---|---|---|
| 6,297,154 | B1 | 10/2001 | Gross et al. |
| 6,329,701 | B1 | 12/2001 | Ngo et al. |
| 6,358,840 | B1 | 3/2002 | Wang et al. |
| 6,975,032 | B2 | 12/2005 | Chen et al. |
| 8,093,149 | B2 | 1/2012 | Tomita |
| 8,716,127 | B2 | 5/2014 | Yang et al. |
| 8,946,896 | B2 | 2/2015 | Moreau et al. |
| 9,209,135 | B2 | 12/2015 | Kim et al. |

(Continued)

OTHER PUBLICATIONS

Kohl et al., Low k, Porous Methyl Silsesquioxane and Spin-On-Glass, Electrochemical and Solid-State Letters, 2 (2) 77-79 (Year: 1999).*

*Primary Examiner* — Niki H Nguyen
(74) *Attorney, Agent, or Firm* — Cantor Colburn LLP; James Nock

(57) ABSTRACT

According to embodiments of the present invention, a semiconductor wafer includes a substrate and an interlayer dielectric located on the substrate. The interlayer dielectric includes an interconnect. A barrier layer is located in between the interconnect and the interlayer dielectric. A semi-liner layer is located in between the interconnect and the barrier layer. The interlayer dielectric, the interconnect, and barrier layer form a substantially planar surface opposite the substrate. The interconnect has an interconnect height from a base to the substantially planar surface and a semi-liner height of the semi-liner layer is less than the interconnect height such that liner layer does not extend to the planar surface.

13 Claims, 4 Drawing Sheets

(56) References Cited

U.S. PATENT DOCUMENTS

| | | | |
|---|---|---|---|
| 2004/0061237 A1 | 4/2004 | Besser et al. | |
| 2006/0234497 A1* | 10/2006 | Yang | H01L 21/76807 438/638 |
| 2006/0234499 A1 | 10/2006 | Kodera et al. | |
| 2009/0026618 A1 | 1/2009 | Kim et al. | |
| 2009/0155997 A1* | 6/2009 | Shinriki | H01L 21/28562 438/653 |
| 2010/0019386 A1* | 1/2010 | Oh | H01L 21/76846 257/751 |
| 2010/0200991 A1 | 8/2010 | Akolkar et al. | |
| 2010/0295182 A1* | 11/2010 | Hirao | H01L 21/7684 257/751 |
| 2016/0020142 A1* | 1/2016 | Chen | H01L 21/76865 438/654 |
| 2017/0372951 A1 | 12/2017 | Toshima et al. | |

* cited by examiner

CONDUCTIVE INTERCONNECT HAVING A SEMI-LINER AND NO TOP SURFACE RECESS

BACKGROUND

The present invention relates in general to fabrication methods and resulting structures for semiconductor wafers. More specifically, the present invention relates to fabrication methods and resulting structures for providing a conductive interconnect having a semi-liner interconnect and substantially no recesses in the top surface of the interconnect.

Integrated circuit processing generally includes front end of line and back end of line processes. Front end of line processes generally include manufacturing various logical and functional devices whereas back end of line processes generally include forming layers of interconnects thereon to complete the integrated circuit. Metals such as copper have been used in back end of line processes to form interconnects that extend into dielectric layers. A liner layer is often added prior to deposition of the interconnect in order to prevent diffusion of the copper into the dielectric layer.

As devices are scaled to sub-100 nm critical dimensions, formation of reliable sub-100 nm interconnection (interconnects) becomes increasingly difficult. For example, as the feature size of interconnects decreases, deposition of the conductive materials such as copper onto the barrier layer becomes increasingly difficult. In order to overcome this barrier, ruthenium (Ru) has been used as a liner or seed enhancement layer to improve the seed coverage of the conductive layer, thereby enhancing the fill.

SUMMARY

According to an embodiment of the present invention, a semiconductor wafer includes a substrate and an interlayer dielectric located on the substrate. The interlayer dielectric includes an interconnect. A barrier layer is located in between the interconnect and the interlayer dielectric. A semi-liner layer is located in between the interconnect and the barrier layer. The interlayer dielectric, the interconnect, and barrier layer form a substantially planar surface opposite the substrate. The interconnect has an interconnect height from a base to the substantially planar surface and a semi-liner height of the semi-liner layer is less than the interconnect height such that liner layer does not extend to the planar surface.

According to an embodiment of the present invention, a method of forming a semiconductor wafer includes depositing a barrier layer on an interlayer dielectric including a trench, depositing a liner layer on the barrier layer, and depositing a first conductive material on the liner layer to fill the trench. The first conductive material is then planarized (e.g. by chemical mechanical planarization, CMP) and selectively etched to a depth, d, to form a recessed area and the liner layer is selectively etched to a depth, $d_1$, to reduce a wall height of the liner layer to form a semi-liner layer having a semi-liner height and to form a liner recessed area. A second conductive material is then deposited to fill the liner recessed area to form an interconnect and the second conductive material is planarized to form a substantially planar surface. The interlayer dielectric, the interconnect, and barrier layer form the substantially planar surface and the semi-liner height of the semi-liner layer is less than the interconnect height such that liner layer does not extend to the planer surface.

BRIEF DESCRIPTION OF THE DRAWINGS

FIGS. 2-10 depict fabrication operations for forming selected portions of the semiconductor wafers shown in FIG. 1, in which:

FIG. 2 is a cross-sectional view of an initial semiconductor structure after the formation of trench regions according to embodiments of the invention;

FIG. 3 is a cross-sectional view of the semiconductor structure after deposition of a barrier layer according to embodiments of the invention;

FIG. 4 is a cross-sectional view of the semiconductor structure after deposition of a liner layer according to embodiments of the invention; and FIG. 5 is a cross-sectional view of the semiconductor structure after deposition of a first conductive material seed layer according to embodiments of the invention.

FIG. 6 is a cross-sectional view of the semiconductor structure after deposition of a first conductive material filler layer according to embodiments of the invention.

FIG. 7 is a cross-sectional view of the semiconductor structure after a planarization process and a selective conductive material etch process according to embodiments of the invention.

FIG. 8 is a cross-sectional view of the semiconductor structure after formation of the semi-liner layer via a selective liner layer etch process according to embodiments of the invention.

FIG. 9 is a cross-sectional view of the semiconductor structure after deposition of a second conductive material seed layer according to embodiments of the invention.

FIG. 10 is a cross-sectional view of the semiconductor structure after deposition of a second conductive material filler layer according to embodiments of the invention.

DETAILED DESCRIPTION

It is understood in advance that, although this description includes a detailed description of the formation and resulting structures for a specific architecture, implementation of the teachings recited herein are not limited to a particular type of integrated circuit architecture. Rather embodiments of the present invention are capable of being implemented in conjunction with any other architecture, now known or later developed.

For the sake of brevity, conventional techniques related to a semiconductor wafer and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor wafers and semiconductor-based ICs are well known and so, in the interest of brevity, many conventional steps will only be mentioned briefly herein or will be omitted entirely without providing the well-known process details.

As previously noted herein, as the feature size of interconnects decreases, deposition of the conductive material onto the barrier layer becomes increasingly difficult. In order to overcome this barrier, ruthenium (Ru) has been used as a liner or seed enhancement layer to improve the seed coverage, thereby enhancing the fill of the conductive material.

The presence of both the ruthenium containing layer and the conductive material of the interconnect at the surface disadvantageously results in the galvanic corrosion of conductive material, for example, copper, during planarization processes such that a recess is formed in the interconnect. The recess results not only in reduced cosmetic appearances, but also leads to an inadvertently high resistance. Accordingly, a process for making interconnects that addresses the current problems associated with interconnect formation is desired.

Embodiments of this invention provide a semi-liner interconnect device, where the semi-liner layer does not extend to a planar surface of the device. The resulting semi-liner interconnect device results in an improvement, not only to the aesthetics of the device, but also in the resultant resistance of the device due to an increased amount of conductive material present in the interconnect.

Figure 1:
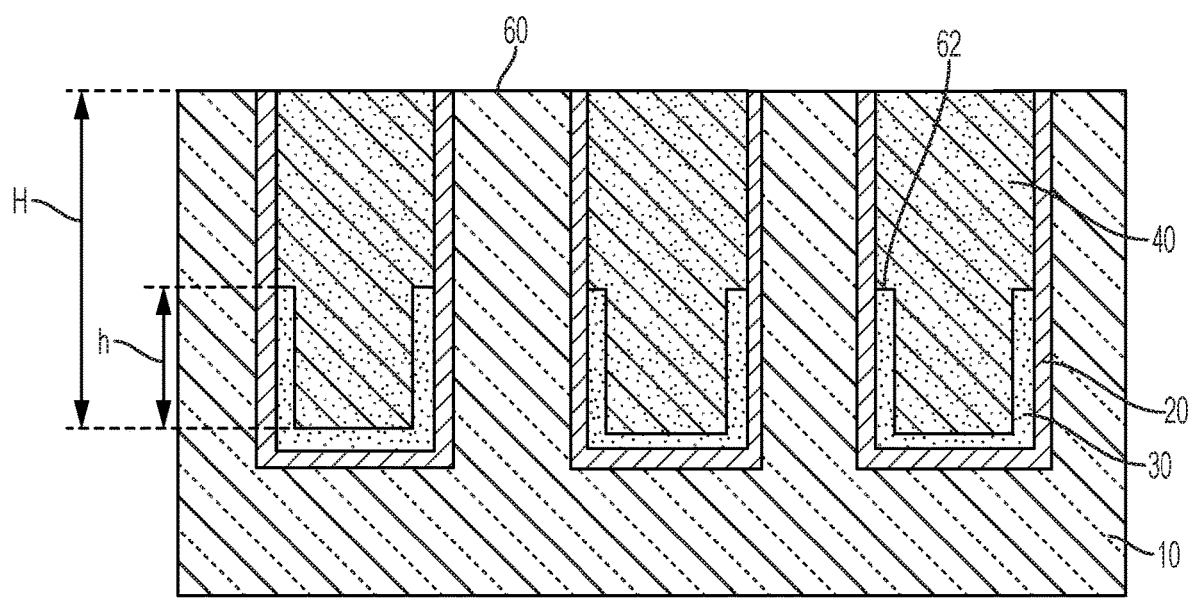
FIG. 1 is a cross-sectional view of a configuration of a semiconductor wafer fabricated according to embodiments of the invention having a semi-liner interconnect without a recess.

FIG. 1 illustrates a portion of a semiconductor wafer having semi-liner interconnect structures formed in an interlayer dielectric region 10 of the wafer in accordance with embodiments of the invention. The semiconductor wafer includes three interconnects 40 located in interlayer dielectric 10. The interlayer dielectric can be located on a substrate, not illustrated. A barrier layer 20 is located in between the interconnect 40 and the interlayer dielectric 10. A semi-liner layer 30 is located in between the interconnect 40 and the barrier layer 20.

A height, h, (extending from a base of the interconnect 40 to the upper surface 62 of the semi-liner layer 30) of semi-liner layer 30 is less than a height, H, (extending from a base of the interconnect 40 to the planar surface 60) of the interconnect 40 such that the material of the semi-liner layer 30 in not present at the planar surface 60. For example, the height, h, can be 10 to 90% of the height, H, or 20 to 80% of the height, H, or 40 to 60% of the height, H. FIG. 1 illustrates that the planar surface 60 can be free of the semi-liner layer 30 and that the conductive material of the interconnect 40 is located in the region between wall surface of the semi-liner layer 30 and the planar surface 60. As used herein, the planar surface 60 being free of the semi-liner layer 30 can mean that the semi-liner layer 30 does not extend to the planar surface 60 and that the material of the semi-liner layer 30 (for example, ruthenium) or any alloy of the material of the semi-liner layer 30 (for example, an alloy with one or more transition metals) are not present at the planar surface 60. As used herein, the terminology of a planar surface means that the surface can be substantially free of recesses (for example, meaning that that the interconnect 40 was not recessed during planarization and is planar with the planar surface 60) or crevices (for example, meaning that the interconnect 40 does not dewet from the barrier layer 20 to form a crevice).

The interlayer dielectric 10 can be located between a device layer or a metallization layer and another metallization layer. The interlayer dielectric 10 can have a low dielectric constant, commonly referred to as a low-k dielectric. The low-k dielectric can have a dielectric constant of less than 3.0. Use of a low-k dielectric can be advantageous because they can decrease overall capacitance, which increases device speed and allows lower voltages to be utilized (making the device smaller and less expensive).

The interlayer dielectric 10 includes one or more trenches (e.g., trench 12 shown in FIG. 2) where the interconnects 40 are located. The interconnect 40 can be via structures, dual damascene trenches, or combinations thereof. The trenches can be, for example, grooves or holes. The trenches can be formed by known techniques, for example, using photolithography or etching.

The barrier layer 20 serves to constrain the conductive material, such as copper, used to eventually fill the trench regions so that it does not migrate into the interlayer dielectric 10. Exemplary barrier materials include at least one of phosphosilicate glass (PSG), silicon nitride, silicon oxynitride, aluminum oxide ($Al_xO_y$), niobium, molybdenum, tungsten, tungsten nitride, titanium, titanium nitride, tantalum, or tantalum nitride (TaN). Specifically, the barrier material can include at least one of titanium, titanium nitride, tantalum, or tantalum nitride (TaN). A thickness of the barrier layer can be greater than or equal to 1 nanometer, or 1 to 20 nanometers.

The barrier layer 20 can include a first barrier layer and a second barrier layer. Examples of first barrier layers and second barrier layers include TiN/Ta, TaN/Ta, and WN/Ta.

The semi-liner layer 30 serves as a seed layer for deposition of the conductive material in the trench region. The semi-liner layer 30 can include at least one of ruthenium, osmium, rhodium, palladium, platinum, or iridium. Preferably, the semi-liner layer 30 includes ruthenium. A thickness of the semi-liner layer 30 can be 10 to 50 angstroms.

The interconnect 40 can include at least one of copper, tungsten, cobalt, or their alloys. Specifically, the interconnect 40 can include copper or a copper alloy.

FIGS. 2-10 illustrate a portion of the semiconductor wafer after various fabrication operations have been performed in accordance with embodiments of the present invention. More specifically, the portion of the semiconductor wafer shown in FIGS. 2-10 is the interlayer dielectric region 10. The novel aspects of the invention can be applied to a wide range of planar and non-planar architectures that utilize interconnects.

Figure 2:
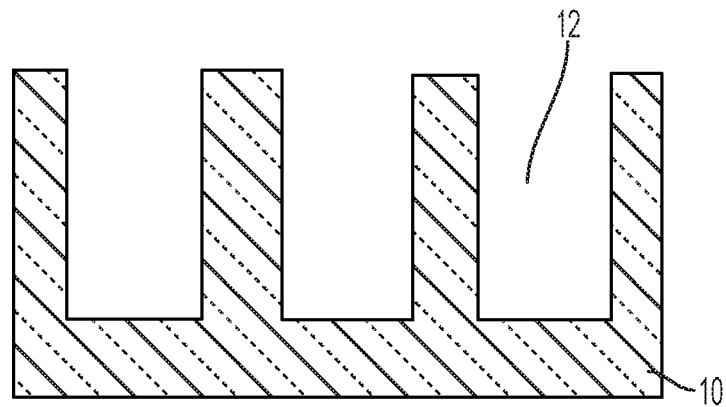

In FIG. 2, known fabrication operations are used to form trench regions 12 in the interlayer dielectric 10. The trench regions 12 (also referred to herein as trenches) in the interlayer dielectric 10 can be formed by operations such as photolithography or etching known in the art. The trenches 12 can each independently be grooves or holes or can have other configurations. A width of the trenches can be 10 to 100 nanometers.

Figure 3:
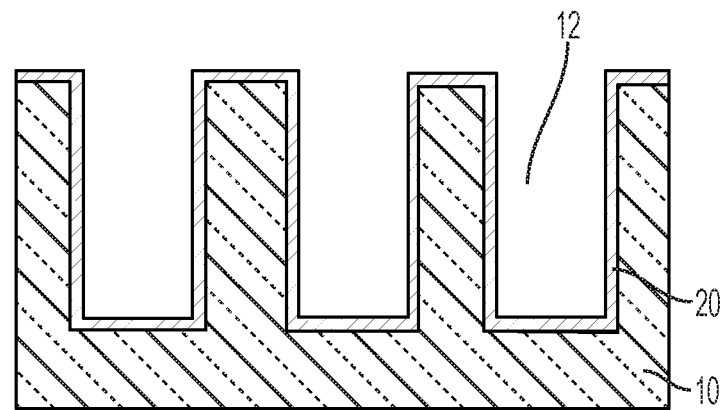

In FIG. 3, known fabrication operations are used to deposit the barrier layer 20 in the trench regions 12. The barrier layer 20 can be formed by physical vapor deposition (PVD), chemical vapor deposition (CVD), or atomic layer deposition (ALD) processes known in the art.

Figure 4:
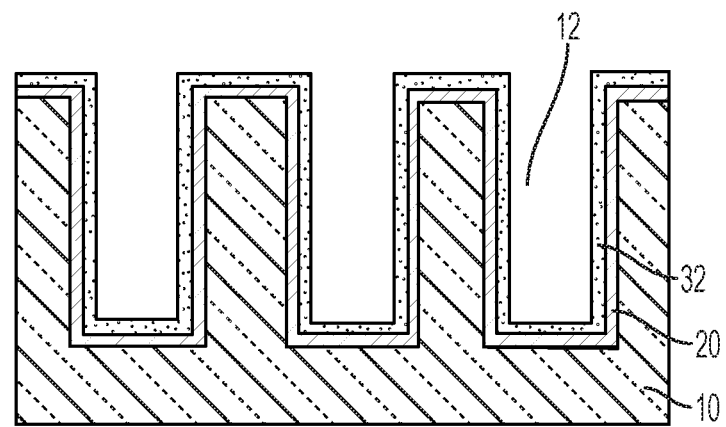

In FIG. 4, known fabrication operations are used to deposit the liner layer 32 in the trench region 12 on the barrier layer 20. The liner layer 32 can be formed by physical vapor deposition (PVD), chemical vapor deposition (CVD) or atomic layer deposition (ALD) processes known in the art.

Figure 5:
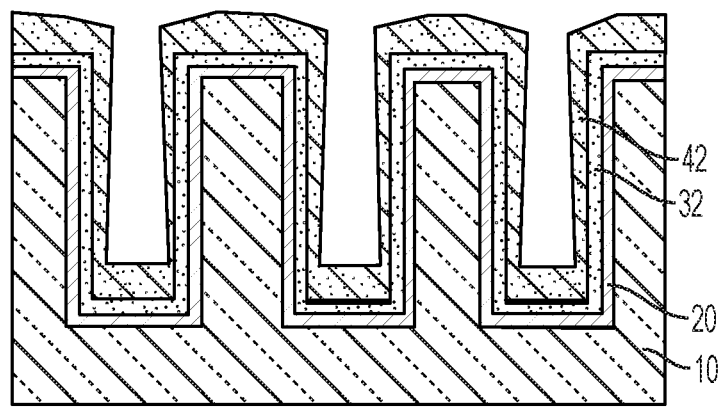

In FIG. 5, known fabrication operations are used to deposit a first conductive material seed layer 42. The first conductive material seed layer 42 can act as a cathode for electroplating the conductive material into the trench. The first conductive material seed layer 42 can be deposited by physical vapor deposition (PVD), chemical vapor deposition (CVD), or by electroless plating. A thickness of the first conductive material seed layer 42 can be at least 3 nanometers, or 3 to 40 nanometers.

Figure 6:
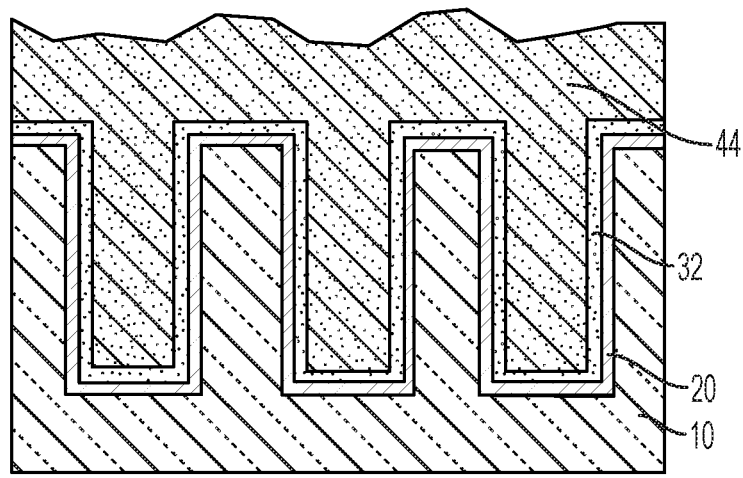

In FIG. 6, known fabrication operations are used to deposit a first conductive material fill layer 44. The first conductive material fill layer 44 can be deposited by electroplating.

Figure 7:
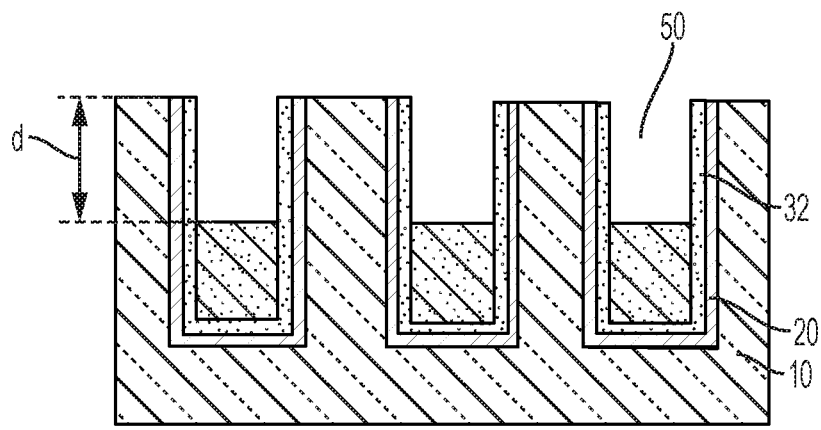

In FIG. 7, known fabrication methods are used to etch the conductive material layer. The conductive material layer and the liner and barrier layers on the planar surface can first be removed by chemical mechanical polishing, a wet clean, or via a slurry chemistry, or etched by a dry or wet chemistry. The conductive material can then be selectively removed to a depth, d, below the planar surface 60 by a dry or a wet etch to form a conductive material recessed area 50.

Figure 8:
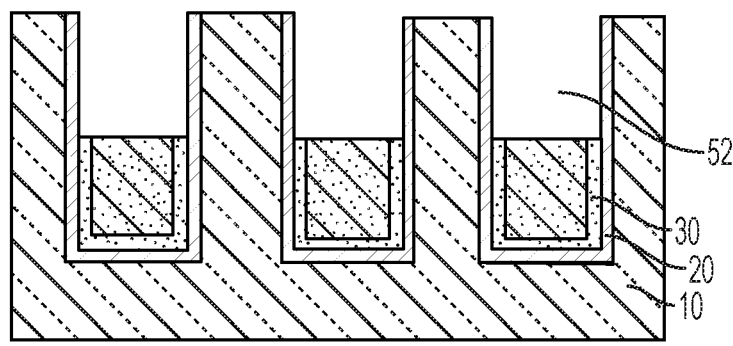

In FIG. 8, known fabrication operations are used to etch the liner layer 32 (shown in FIG. 7) to form semi-liner layer 30. The liner layer 32 can be etched by a dry or a wet etch. The liner layer 32 can be removed to the depth, $d_1$, below the planar surface 60 to form a liner recessed area 52. The depth, $d_1$, can be the same or different as the depth, d. The depth, $d_1$, can be within 30%, or within 15%, or within 1% of the depth, d.

Figure 9:
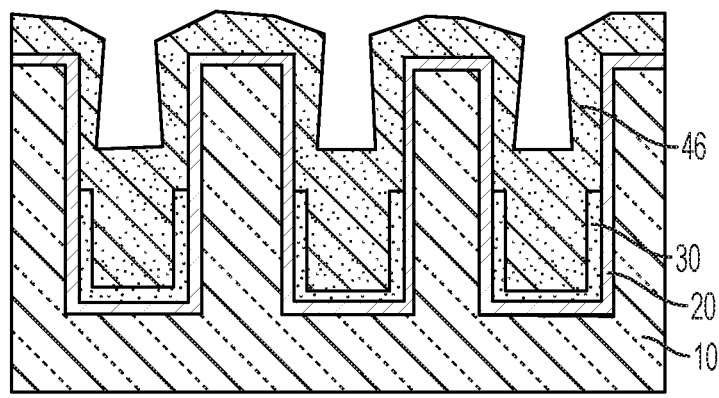

In FIG. 9, known fabrication method are used to deposit a second conductive material seed layer 46. The second conductive material seed layer 46 can act as a cathode for electroplating conductive material into the liner recessed area 52. The second conductive material seed layer 46 can be deposited by physical vapor deposition (PVD), chemical vapor deposition (CVD), or by electroless plating. A thickness of the second conductive material seed layer 46 can be at least 3 nanometers, or 3 to 40 nanometers.

Figure 10:
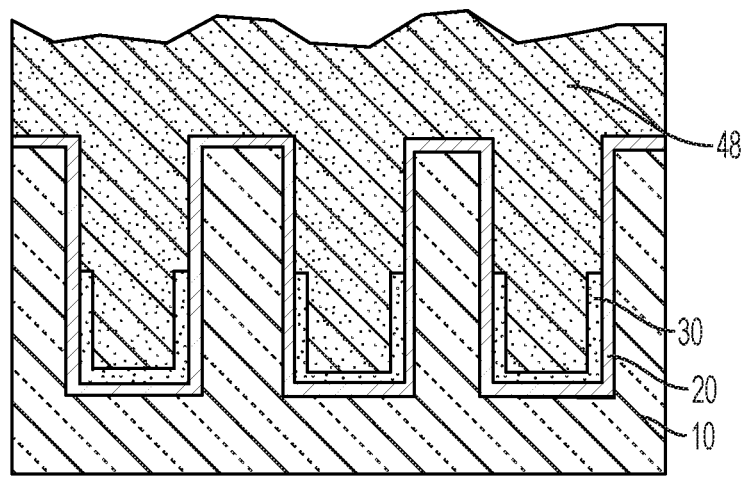

In FIG. 10, known fabrication method are used to deposit a second conductive material fill layer 48. The second conductive material fill layer 48 can be deposited by electroplating. Alternatively, the conductive material layer can be filled by a wet or dry fill method, for example, by copper reflow.

After forming the second conductive material filler layer 48, known fabrication methods can be used to planarize the surface (for example, by chemical mechanical polishing) to form the interconnect structures shown FIG. 1. Here, the conductive material layer 48 can be polished so that only the portion of the conductive material that remains is the portion of the conductive material that is in the trenches and so that no recess of conductive material in the trenches is formed. In other words, the planar surface 60 can be formed that includes the interconnect 40, the barrier layer 20, and the interlayer dielectric 10. The planarized surface can be free of the semi-liner layer 30.

Before or after either of the deposition of the first conductive material fill layer 44 or the second conductive material fill layer 48, the device can be annealed. The temperature, time, and duration of the respective annealing steps can be selected to achieve a desired grain structure of the conductive material. In general, the smaller the grain size when the conductive material is deposited, the better the fill. However, after the conductive material is deposited, it is advantageous to increase the grain size of the conductive material to the large grain state in order to improve the electrical characteristics of resulting device. As used herein, grain sizes of 0.1 to less than a width of the trench can be achieved, where the grain size can be selected to be less than 1 micrometer, or 0.1 to 0.9 micrometers, or 0.1 to 0.3 micrometers.

After planarization of the surface 60, a passivation layer (not shown) can be formed. The passivation layer can prevent the interconnect from oxidation and diffusion. The passivation layer can include silicon nitride ($Si_3N_4$).

The interlayer dielectric 10 is part of a semiconductor wafer/substrate (not shown). The substrate can include a semiconducting material. The substrate can include silicon, germanium, carbon, gallium, arsenic, indium, phosphorus, a remaining Group III or V compound, or a combination including at least one of the foregoing. Examples of semiconducting materials include silicon (Si), germanium (Ge), silicon germanium (SiGe), silicon carbide (SiC), silicon germanium carbon (SiGeC), gallium (Ga), gallium arsenide (GaAs), indium arsenide (InAs), and indium phosphide (InP). The substrate can include an organic semiconductor or a layered semiconductor such as Si/SiGe, a semiconductor-on-insulator (such as silicon-on-insulator or a SiGe-on-insulator).

The process of the present invention can be used to make interconnects to device structures including polysilicon gates, word lines, source regions, drain regions, bit lines, base emitters, collectors, etc. It will be readily apparent to one skilled in the art that the present invention can be used with any semiconductor technology such as, for example, MOS (metal-oxide-semiconductor) devices (e.g., NMOS, PMOS, CMOS, and BiCMOS), bipolar devices, multi-chip modules, or III-V semiconductors.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. The term "or" means "and/or." The terms "at least one" and "one or more" are understood to include any integer number greater than or equal to one, i.e. one, two, three, four, etc.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The term "direct contact" means that a first element, such as a first structure, and a second element, such as a second structure, are connected without any intermediary conducting, insulating or semiconductor layers at the interface of the two elements. Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer. It is noted that one or more of the layers described herein are conformal layers.

As previously noted herein, for the sake of brevity, conventional techniques related to semiconductor wafer and integrated circuit (IC) fabrication may or may not be described in detail herein. By way of background, however, a more general description of the semiconductor wafer fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor wafer according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor wafer, the method comprising:
   depositing a barrier layer on an interlayer dielectric comprising a trench;
   depositing a liner layer on the barrier layer;
   depositing a first conductive material on the liner layer to fill the trench;
   selectively etching the first conductive material to a depth, d, to form a conductive material recessed area;
   selectively etching the liner layer to a depth, d1, to reduce a wall height of the liner layer to form a semi-liner layer having a semi-liner height and to form a liner recessed area, wherein the depth, dl, is within 30% of the depth, d;
   depositing a second conductive material to fill the liner recessed area to form an interconnect; and
   planarizing the second conductive material to form a planar surface, wherein the interlayer dielectric, the interconnect, and barrier layer form the planar surface and wherein the semi-liner height of the semi-liner layer is less than the interconnect height such that liner layer does not extend to the planar surface.

2. The method of claim 1, wherein the depth, d1, is within 30% of the depth, d.

3. The method of claim 1, wherein the semi-liner height is 10 to 90% of the interconnect height.

4. The method of claim 1, wherein the semi-liner height is 20 to 80% of the interconnect height.

5. The method of claim 1, wherein the planar surface is substantially free of both recesses and crevices.

6. The method of claim 1, further comprising forming the trench in the interlayer dielectric prior to depositing the barrier layer.

7. The method of claim 6, further comprising depositing the interlayer dielectric on a substrate prior to forming the trench.

8. A method of forming a semiconductor wafer, the method comprising:
   depositing a barrier layer on an interlayer dielectric comprising a trench; depositing a liner layer on the barrier layer;
   depositing a first conductive material on the liner layer to fill the trench, wherein depositing the first conductive material comprises first depositing a first copper seed layer and then electroplating a first copper fill layer on the first copper seed layer;
   selectively etching the first conductive material to a depth, d, to form a conductive material recessed area:
   selectively etching the liner layer to a depth, di, to reduce a wall height of the liner layer to form a semi-liner layer having a semi-liner height and to form a liner recessed area;
   depositing a second conductive material to fill the liner recessed area to form an interconnect, wherein depositing the second conductive material comprises first depositing a second copper seed layer and then electroplating a second copper fill layer on the second copper seed layer;
   planarizing the second conductive material to form a planar surface, wherein the interlayer dielectric, the interconnect, and barrier layer form the planar surface and wherein the semi-liner height of the semi-liner layer is less than the interconnect height such that liner layer does not extend to the planar surface.

9. The method of claim 8, wherein the semi-liner height is 10 to 90% of the interconnect height.

10. The method of claim 8, wherein the semi-liner height is 20 to 80% of the interconnect height.

11. The method of claim 8, wherein the planar surface is substantially free of both recesses and crevices.

12. The method of claim 8, further comprising forming the trench in the interlayer dielectric prior to depositing the barrier layer.

13. The method of claim 12, further comprising depositing the interlayer dielectric on a substrate prior to forming the trench.

* * * * *